United States Patent [19]

Rossow

[11] Patent Number: 4,523,094
[45] Date of Patent: Jun. 11, 1985

[54] EVALUATION DEVICE FOR ELECTRON-OPTICAL IMAGES

[75] Inventor: Eberhard Rossow, Oberkochen, Fed. Rep. of Germany

[73] Assignee: Carl-Zeiss-Stiftung, Heidenheim/Brenz, Oberkochen, Fed. Rep. of Germany

[21] Appl. No.: 578,126

[22] Filed: Feb. 8, 1984

Related U.S. Application Data

[63] Continuation-in-part of Ser. No. 345,387, Feb. 3, 1982.

[30] Foreign Application Priority Data

Feb. 27, 1981 [DE] Fed. Rep. of Germany ... 8105611[U]

[51] Int. Cl.³ .............................................. H01J 37/26
[52] U.S. Cl. ..................................... 250/311; 353/40; 353/42; 364/520
[58] Field of Search .................. 250/306, 311; 353/40, 353/42; 364/520

[56] References Cited

U.S. PATENT DOCUMENTS

| 2,233,286 | 2/1941 | Marton | 250/311 |
| 3,614,410 | 10/1971 | Bailey et al. | 364/520 |
| 3,915,568 | 10/1975 | Yamada et al. | 353/99 |
| 4,206,349 | 6/1980 | Kamimura | 250/311 |

Primary Examiner—Alfred E. Smith
Assistant Examiner—Jack I. Berman
Attorney, Agent, or Firm—Hopgood, Calimafde, Kalil, Blaustein & Judlowe

[57] ABSTRACT

The invention contemplates an electron microscope having provision for semi-automatic evaluation of the electron-optical image of the microscope, by superposing a light-optical image on the electron-optical image. For this purpose, an image plane (14) near the microscope column is imaged via two deflection mirrors (23, 25) and by an objective (24) onto the output-image fluorescent screen. A marking device having a light spot or an illuminated measurement diaphragm or the cursor of a digitizer equipped with a light spot is movable in the image plane (14).

9 Claims, 8 Drawing Figures

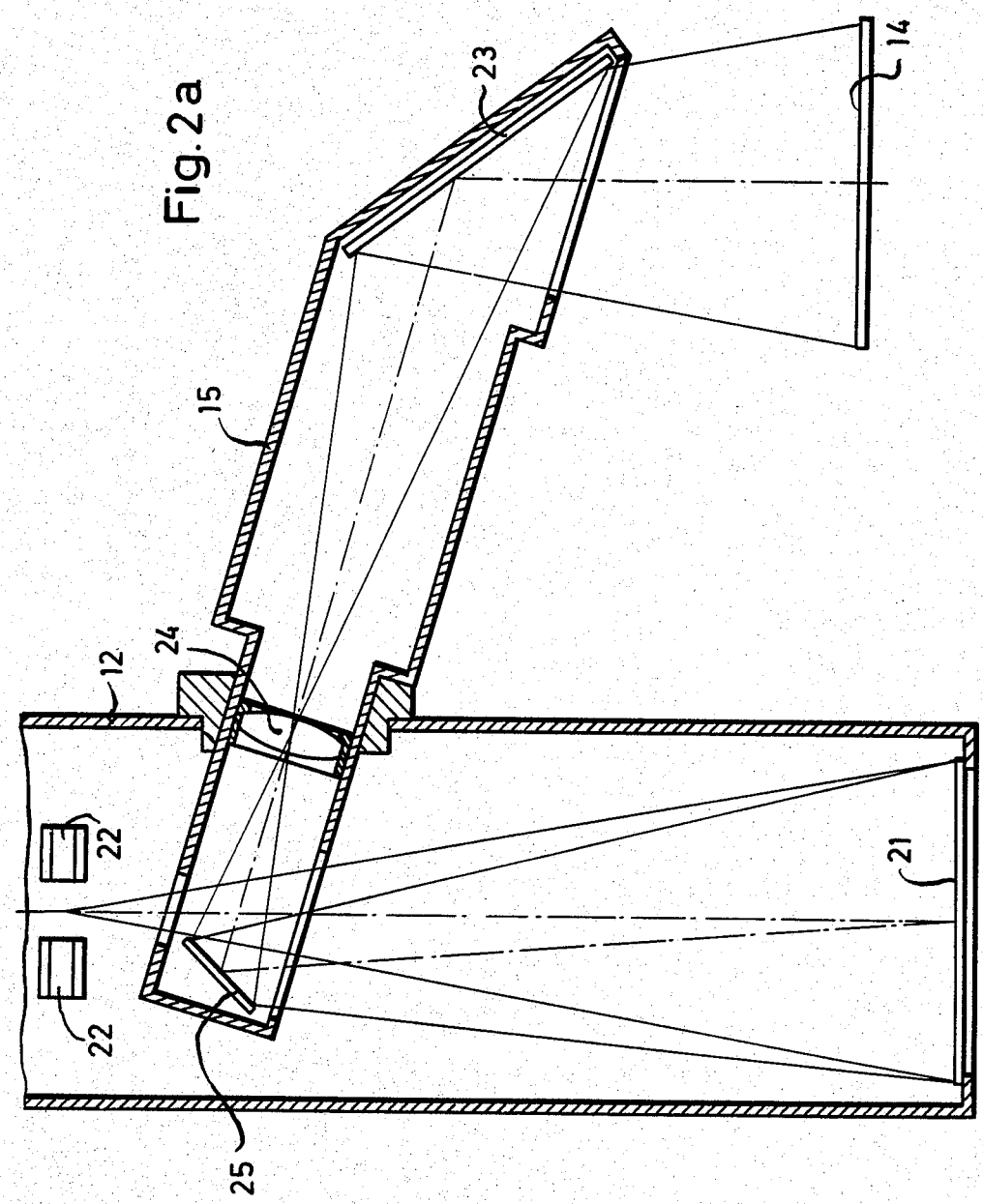

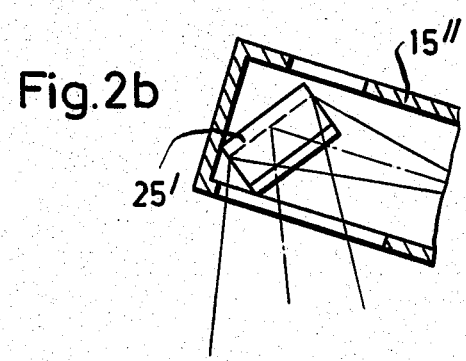
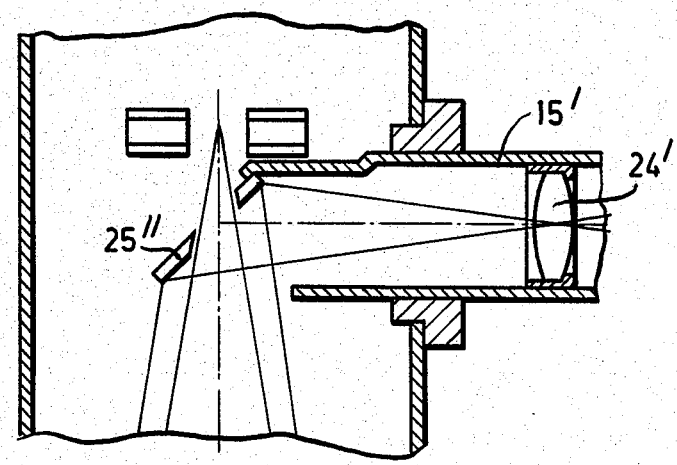
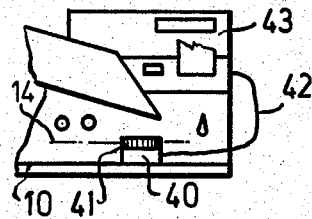
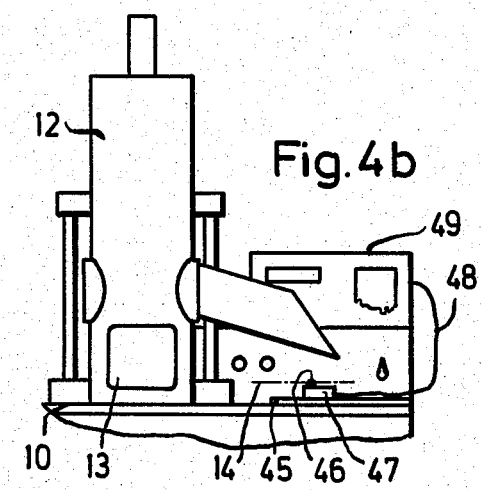

EVALUATION DEVICE FOR ELECTRON-OPTICAL IMAGES

This is a continuation of copending application Ser. No. 345,387, filed Feb. 3, 1982.

BACKGROUND OF THE INVENTION

The present invention concerns a device for evaluation electron-optical images by simultaneous observation of the electron-optical image and of a light-optical image. The invention refers in particular to the semi-automatic evaluation of images while they are produced in an electron microscope.

Devices for semi-automatic and full automatic evaluation are known for electron-optical photographs. Devices are also known for the fully automatic evaluation of images while they are produced in an electron microscope. They operate with television camera tubes and employ extensive electronic circuits or computers for the evaluation. They are therefore costly and expensive. In many cases, however, a semi-automatic device is preferable, namely when decision criteria are clearly perceptible to the eye but cannot be recognized by an automatic system. Semi-automatic devices which proceed from an object image on which an image analysis is effected are known. However, in electron microscopes, the visible image is produced on a fluorescent screen in an evacuated microscope column, and, therefore, the known semi-automatic devices require that a photographic recording first be made and processed so that such recording can be the basis on which image analysis may thereafter be effected.

For direct semi-automatic evaluation of an electron-optical fluorescent-screen image, it is advisable to observe the electron-optical image at the same time as a light-optical image. The light-optical image may include, for example, a displaceable, variable-diameter measurement diaphragm for determining particle size. A semi-transparent mirror may be arranged in front of the normal viewing window, said mirror permitting simultaneous observation of the electron-optical image and a light-optical image. The disadvantages of such a device are clear, in that brightness of the electron-optical image is greatly reduced for the observer. Furthermore, the device is expensive and takes up a large amount of space, which is inconvenient, particularly in front of the microscope column, since it limits accessibility to the operating elements of the electron microscope.

BRIEF DESCRIPTION OF THE INVENTION

The object of the present invention is to create an inexpensive apparatus of simple construction which permits direct evaluation of an electron-optical fluorescent-screen image; the brightness of the electron-optical image is to be affected only slightly if at all, and accessibility to the electron microscope is to be limited only slightly if at all.

The invention achieves this object by providing alongside the electron microscope an image plane for the light-optical image and by providing a housing which is attached laterally to the electron microscope, and which extends within the vacuum; a first deflection mirror within the vacuum, an objective, and another deflection mirror, are arranged for focusing the image plane on the output-image fluorescent screen of the electron microscope.

In one preferred embodiment, one of the two deflection mirrors is developed as a roof mirror so that the image plane is imaged without bottom/top reversal on the output-image fluorescent screen. Within the housing, a window is necessary to complete the enclosure of the vacuum space from the outside; in another embodiment, the objective or a lens element of the objective is used for this purpose.

A tracing device having a light spot is movable in the image plane for making or tracing of important image details. For semi-automatic image evaluation, a known illuminated variable measurement diaphragm is displaced in the image plane. It is furthermore possible to arrange a magnetic board parallel to the image plane and to transfer coordinates of position to an evaluation unit by means of a cursor which has a light spot in the image plane.

A significant advantage of the invention is that the image plane is arranged in a very favorable position for performing operations necessary for a semi-automatic image analysis and that, at the same time, good accessibility to the operating elements of the electron microscope is also assured. Another advantage is the fact that the brightness of the electron-optical image is not affected.

DETAILED DESCRIPTION

The invention will be described in further detail in conjunction with the accompanying drawings, in which:

FIGS. 2a, 2b and 2c are enlarged fragmentary vertical sectional views in the plane of optical axes to show illustrative embodiments of the new apparatus;

FIGS. 4a and 4b are front views in elevation of the new device together with a device for particle-size analysis and with a device for digital evaluation.

Figure 1:
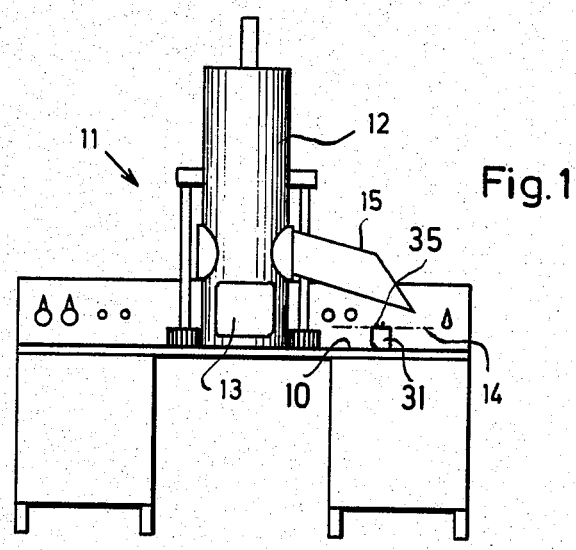
FIG. 1 is an overall front view in elevation of the new device together with an electron microscope and the tracking device.

In FIG. 1, an electron microscope 11 has a microscope column 12, and the output-image fluorescent screen is observed through a window 13. To the side of the microscope column 12 there is arranged, in accordance with the invention, an image plane 14 which is focused by optical parts in a housing 15 onto the output-image fluorescent screen.

FIG. 2a shows the construction of an illustrative embodiment of the new apparatus, in conjunction with the microscope column 12. The electron-optical image of the microscope is produced on the output-image fluorescent screen 21 by an electron-optical lens 22, shown schematically. Superposed on this image is the light-optical image of an image plane 14, which, via mirrors 23 and 25, is focused by an objective 24 on the output-image fluorescent screen. In this way, it is possible, for example, to mirror into the electron-optical image a line pattern which lies in the image plane 14 and is there illuminated. Further possibilities for reflection into the electron-optical image will be described later. For most applications, such imaging is advantageous on a 1:1 scale.

It is advisable to develop one of the two mirrors 25 or 23 as a roof prism (with an angle of 90°) in order to obtain imaging without bottom/top reversal. This is shown for mirror 25, in FIG. 2b, in which the roof mirror is designated as 25'. If (to avoid having the mirror mask any of the electron ray path) the mirror 25 is not arranged to reflect precisely perpendicular to the output-image fluorescent screen, the central ray via the mirror will not be perpendicular to the output-image fluorescent screen. As a result, a (slight) distortion occurs upon the imaging. This can, however, be substantially compensated by having the central ray strike the image plane 14 at a suitable angle. In another embodiment, an objective having a larger image angle is used in such a manner that the axis of the objective impinges perpendicularly on the output-image fluorescent screen (at axial offset from the electron-optical ray axis) and on the image plane, only a part of the image field being utilized; in this case, no distortion occurs, but the expense for the objective is greater. In both cases, it is advisable to design the ray path in such manner that the mirror 25 acts as a limiting diaphragm and to arrange the mirror 25 as close as possible to the electron-optical ray path. In a further embodiment of the present invention shown in FIG. 2c, the mirror 25" is provided with a hole for the electron optical ray path and is arranged to reflect the central ray on an alignment perpendicular to the output-image fluorescent screen; again, no distortion occurs.

Figures 3A, 3B:
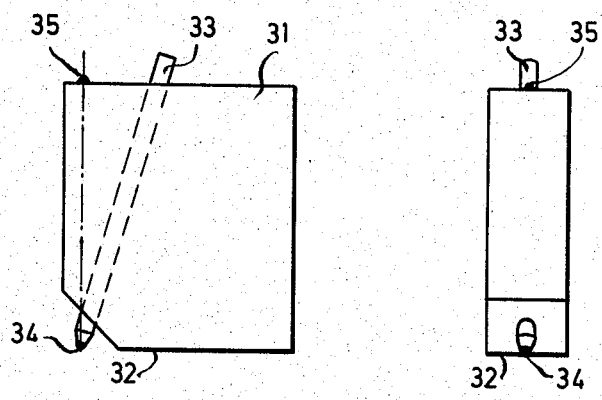
FIGS. 3a and 3b are side and front views of an tracing device.

A tracing device as shown in FIG. 3 is used for the marking and tracing of important image details. This device consists of a rectangular parallelepiped 31 having a planar base or standing surface 32 on which it can be variously positioned back and forth in the drawing plane 10. A stylus 33 having a marking point 34 is detachably seated in the tracing device; it may, for instance, be a ball-point pen, a felt-tip pen or the like. Precisely vertically above the marking point 34, there is a light spot 35, which may consist of a light-emitting diode or a diaphragm which is illuminated by an incandescent bulb. The supply of electric current may be effected either by a rechargeable battery within the drawing unit or via a flexible power cord. The tracing device can be moved in the drawing plane 10, shown in FIG. 1. Thereby the light spot 35 is moved in the image plane 14 and imaged by the above-described apparatus shown in FIG. 2 onto the output-image fluorescent screen of the electron microscope and is superposed on the electron-optical image. In this way, the imaged light spot can easily be brought to given points of the electron optical image and contours of image details followed and marked or traced in the drawing plane 10. The tracing of image contents affords the advantage over photographic recording that one can limit oneself to the essential parts of the content of the image.

The described apparatus will be further seen to lend itself to the known Endter particle-size analysis. For this purpose as shown in FIG. 4a, a variable illuminated measurement diaphragm 40 is so placed in the image plane 14 that the imaging thereof in the electron-optical image is superposed on the particles or structures to be evaluated. For area measurements, the diameter of the diaphragm is so changed by turning a knurled ring 41 that the area of the light spot is approximated to the particle area. For length measurements, the diameter of the diaphragm is adapted to the length of the particle. Upon depression of a button or a foot-operated switch, the diaphragm diameter will be transferred via line 42 to an evaluation unit 43 and be further processed there. The evaluated particles can additionally be marked in the drawing plane 10.

The apparatus described can be used furthermore for the direct measurement of coordinates, lengths and areas and for the counting of points. For this, the table 45 of a digitizer, which for instance carries out in known manner a coordinate determination by delay-time measurement of magnetically induced waves, is placed in the drawing plane 10, as shown in FIG. 4b. The cursor 47 which forms part of the apparatus is equipped with a light-emitting diode 46 rather than with the otherwise customary crosshairs, the diode arranged in the image plane 14 being imaged via the apparatus described above and shown in FIG. 2 onto the output-image fluorescent screen of the electron microscope. During the observation of the electron-optical image, the light spot of the light-emitting diode can be moved to any place of the image. Upon pushing a button on the cursor, the coordinates of this location are transferred via line 48 to an evaluation unit 49 for further processing. Aside from the cursor, a marking stylus with built-in light-emitting diode can also be used.

What is claimed is:

1. In an electron microscope having an evacuated envelope with a window (13) through which an output-image fluorescent screen (21) of the microscope is observable, the microscope including electron-optical means (22) for projecting a divergent beam of electrons to form an output image upon said screen (21), a device for evaluating electron-optical images by simultaneous observation of the electron-optical image and of a light-optical image; said device comprising means external to said envelope for establishing an image plane (14) of a visible-light plane, a housing (15) attached to and forming part of said envelope and extending both into and out of said envelope at a location offset from both said screen (21) and said image plane (14), and light-image projecting means carried by said housing and comprising an objective (24) within said housing and a reflector (25) within said envelope and a reflector (23) outside said envelope, said reflectors and objective being positioned to superpose the central ray from the light-image plane (14) upon the intercept of the electron-optical axis with said fluorescent screen (21), and said reflector within said envelope being positioned near said electron-optical means and in clearance with the electron beam whereby to achieve substantial directional conformance of focused electron-optical and of focused light-optical impingement upon said screen.

2. A device according to claim 1, in which one of the two reflectors (23, 25) is a roof prism (e.g. 25').

3. A device according to claim 1, in which the reflector (25") within said envelope has an aperture and that the electron-optical axis passes through the aperture, whereby electron-optical imaging is effected through the reflector (25").

4. A device according to claim 1, in which the interior of said housing is hermetically sealed by window means.

5. A device according to claim 1, in which said window means includes said objective (24) or a lens of said objective (24), and in which the hermetic seal is via the mount of said objective or of said lens of the objective.

6. A device according to claim 1, in which a planar drawing surface (10) is provided beneath and parallel to said image plane (14) and that a tracing device (31) having a drawing stylus (33) is displaceable on the drawing plane (10), said tracing device (31) having a flat resting surface (32) and a light spot (35) being arranged in the image plane (14) at a location and on an alignment on a normal to the resting surface (32) and above the drawing point (34) of the stylus (33).

7. A device according to claim 1, in which an illuminated measurement diaphragm (40) of variable diameter is connected with an evaluation unit (43) and is displaceable in the image plane (14).

8. A device according to claim 1, in which a digitizer has a table (45) in the drawing plane, and in which a cursor (47) having a light spot (46) in the image plane (14) is displaceable on said table and therefore on the drawing plane (10), and in which the table and cursor are connected with an evaluation unit (49).

9. The method of using a stylus-mounted light source to aid the analysis of a viewable electron-optical image at the image plane within the envelope of an electron microscope, which method comprises establishing a reference plane of movable stylus support external to the microscope envelope, whereby movement of the stylus on said support necessarily moves the light source in a light-source plane at constant offset from the support plane, optically imaging the light-source plane at the electron-image plane by projection through the microscope envelope, whereby the light-spot image may be so moved by stylus manipulation on the support plane as to enable viewed light-spot tracing of a selected profile in a viewed electron-optical image, and entering into computer storage digitized data of stylus displacement in the course of a given manipulated profile tracing.

* * * * *